United States Patent
Wang et al.

(10) Patent No.: US 7,143,389 B2
(45) Date of Patent: Nov. 28, 2006

(54) SYSTEMS AND METHODS FOR GENERATING NODE LEVEL BYPASS CAPACITOR MODELS

(75) Inventors: Yong Wang, Fort Collins, CO (US); Mark D. Frank, Longmont, CO (US); Jerimy Nelson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 223 days.

(21) Appl. No.: 11/089,581

(22) Filed: Jul. 28, 2004

(65) Prior Publication Data

US 2006/0026542 A1    Feb. 2, 2006

(51) Int. Cl.
*G06F 17/50* (2006.01)

(52) U.S. Cl. .................. 716/18; 716/1; 716/12; 716/19

(58) Field of Classification Search .............. 716/1, 716/12, 13, 18, 19
See application file for complete search history.

(56) References Cited

U.S. PATENT DOCUMENTS

| | | | |
|---|---|---|---|
| 5,610,833 A | 3/1997 | Chang et al. | |
| 5,691,910 A | 11/1997 | Thodiyil | |
| 5,838,947 A | 11/1998 | Sarin | |
| 5,889,685 A | 3/1999 | Ramachandran | |
| 6,345,379 B1 | 2/2002 | Khouja et al. | |
| 6,449,578 B1 | 9/2002 | McBride | |
| 6,532,439 B1 | 3/2003 | Anderson et al. | |
| 6,571,184 B1 | 5/2003 | Anderson et al. | |
| 6,584,598 B1 | 6/2003 | Rao et al. | |
| 6,675,118 B1 | 1/2004 | Wanek et al. | |
| 2003/0212973 A1* | 11/2003 | Lin et al. | 716/6 |
| 2004/0078767 A1* | 4/2004 | Burks et al. | 716/8 |

* cited by examiner

*Primary Examiner*—Thuan Do

(57) ABSTRACT

Systems and methods associated with generating node level bypass capacitor models are disclosed. One embodiment of a system may comprise a plurality of bypass capacitor circuit models associated with respective bypass capacitors and a node level model generator. The node level model generator may associate bypass capacitor information for a plurality of bypass capacitors from a data base associated with a multi-layer structure design with respective bypass capacitor circuit models to provide a node level capacitor model for the plurality of bypass capacitors.

26 Claims, 4 Drawing Sheets

SYSTEMS AND METHODS FOR GENERATING NODE LEVEL BYPASS CAPACITOR MODELS

BACKGROUND

Electronic systems typically employ several different types of electrical interconnecting apparatus having planar layers of electrically conductive material separated by dielectric layers. Some of the conductive layers may be patterned to form electrically conductive signal lines or "traces" to different layers to provide electrical contacts between signals, power and ground terminals. For example, integrated circuits typically have several layers of conductive traces which interconnect electronic devices formed upon and within a semiconductor substrate. Additionally, these electrical traces may be used to electrically connect to pins or leads of the integrated circuits. These pins and leads may then be coupled to a multi-layer ceramic substrate or device package that provide intermediate routing from the integrated circuit pins to terminals of a printed circuit board (PCB). The PCB also typically includes several layers of conductive traces separated by dielectric layers. The conductive traces are used to electrically interconnect terminals of electronic devices mounted upon the PCB.

Signal frequencies of digital electronic systems are continually increasing. In multi-layer structures (e.g., printed wire boards, ceramic substrates, and/or semiconductor structures), the influence of inductance, capacitance and resistance of the grid (e.g., cell areas of different physical layers of the die and package) have significant effects on the integrity of the digital electronic system as frequencies increase. The effects can include including signal degradation due to reflections, power supply "droop", ground "bounce", and increased electromagnetic emissions. One technique for mitigating power supply droop is the placement of "bypass" or "decoupling" capacitors. The bypass capacitor supplies a substantial amount of the transient load current, thereby reducing the amount of transient load current flowing through the power supply conductors. Determining the proper values, the locations and the optimum number of bypass capacitors for one or more multi-layer structures has been a "trial and error" process.

SUMMARY

One embodiment of the present invention may comprise a system for generating a node level bypass capacitor model. The system may comprise a plurality of bypass capacitor circuit models associated with respective bypass capacitors and a node level model generator. The node level model generator associates bypass capacitor information for a plurality of bypass capacitors from a data base associated with a multi-layer structure design with respective bypass capacitor circuit models to provide a node level capacitor model for the plurality of bypass capacitors.

Another embodiment may comprise a system for generating a node level capacitor model report from package design information provided by a package routing tool. The system may comprise a table that contains a plurality of capacitor sub-circuit models associated with respective bypass capacitor types, and a node level model generator that may extract capacitor type information, capacitor location information, and capacitor netlist assignment information from the package design information for a plurality of bypass capacitors associated with a design. The node level model generator may also associate a capacitor sub-circuit model with each of a plurality of bypass capacitors based on capacitor type, and may provide a formatted node level capacitor model report for the plurality of bypass capacitors employing the capacitor location information and capacitor netlist assignment information.

Yet another embodiment of the present invention may relate to a design tool for providing a node level bypass capacitor model from a package design. The design tool may comprise means for listing a plurality of bypass capacitor sub-circuit models based on bypass capacitor type, means for extracting capacitor type, location and netlist information for a plurality of bypass capacitors from one or more package design reports, means for associating bypass capacitor sub-circuit models with bypass capacitor types for the plurality of bypass capacitor types, and means for generating a formatted node level bypass capacitor model report based on the location and netlist information for each of the plurality of bypass capacitors.

Still another embodiment of the invention may comprise a computer readable medium having computer executable instructions for performing a method. The method may comprise extracting bypass capacitor information from a design database associated with a package design. The method may also comprise associating bypass capacitor sub-circuit model calls with each of a plurality of bypass capacitors based on a given bypass capacitor type, and may comprise generating a plurality of node level bypass capacitor sub-circuit models based on the bypass capacitor information for each of the plurality of bypass capacitors.

Still another embodiment of the invention may comprise a method for generating node level bypass capacitor models. The method may comprise extracting bypass capacitor information for a plurality of bypass capacitors from a design database, associating a bypass capacitor sub-circuit model with each of a plurality of bypass capacitors based on a given bypass capacitor type, and generating a plurality of node level bypass capacitor models based on the extracted capacitor information and the associated bypass capacitor sub-circuit model for each of the plurality of bypass capacitors

DETAILED DESCRIPTION

This disclosure relates generally to systems and methods for generating node level bypass capacitor models. The node level bypass capacitor models can be generated from bypass capacitor information extracted from a package routing tool, and bypass capacitor circuit models. The node level bypass capacitor models can be provided to a circuit design and/or emulation tool to determine if a desirable bypass capacitance associated with a given design has been achieved.

Figure 1:
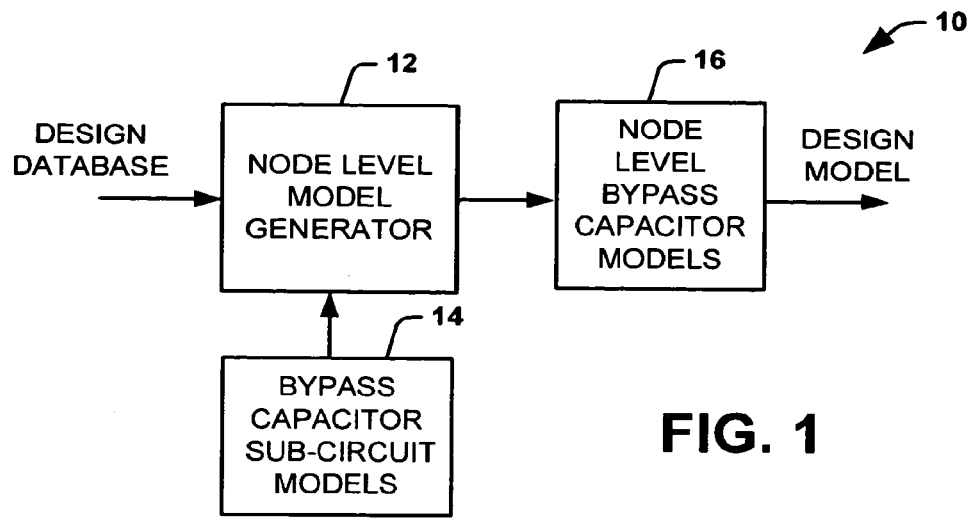
FIG. 1 illustrates a block diagram of an embodiment of a system for generating node level bypass capacitor models.

FIG. 1 illustrates a system 10 for generating node level bypass capacitor models 16. The node level bypass capacitor models 16 provide node level models for a plurality of bypass capacitors distributed over a multi-layer structure, such as an integrated circuit, a ceramic substrate and/or a printed circuit board. The node level bypass capacitor models 16 can be a plurality of resistor-inductor-capacitor (RLC) representations for each of a given bypass capacitor. The RLC representations can be employed by a circuit design or package design tool (e.g., Simulation Program with Integrated Circuit Emphasis (SPICE)) to analyze characteristics of the bypass capacitors associated with a given design. For example, the RLC representations can be input into a circuit design tool along with a system model that includes circuit and/or package models for a given design. The circuit design tool can perform simulations to determine voltage droop, perform power analysis, and AC analysis to determine if a desirable bypass capacitance has been achieved.

The system 10 includes a node level model generator 12 that extracts capacitor information from a design database. The capacitor information can be, for example, capacitor type information, capacitor location information, netlist assignment information, and capacitor orientation information associated with each of a plurality of bypass capacitors. The node level model generator 12 then associates each of the plurality of bypass capacitors with a bypass capacitor sub-circuit model, based on a given capacitor type, from a plurality of bypass capacitor sub-circuit models 14. The plurality of bypass capacitor sub-circuit models 14 can reside in a database or table. The given capacitor types can include, for example, Low Inductance Chip Capacitors (LICCs), Multilayer Ceramic Capacitors (MLCs), Low Inductance Capacitor Arrays (LICAs), and Inter Digitated Capacitors (IDCs) and other capacitor types of varying characteristics.

The node level model generator 12 employs the bypass capacitor sub-circuit models 14 along with other capacitor information (e.g., capacitor location information, netlist assignment information, and capacitor orientation) to generate the plurality of node level bypass capacitor models 16. The plurality of node level bypass capacitor models 16 can be provided as a formatted report (e.g., a SPICE deck) that can be provided to a design tool (e.g., SPICE) concurrently with a design model. The design model can include circuit and/or package design models associated with a given package design. The design tool can then perform simulations to analyze voltage droop, power, and AC effects to determine if a desirable bypass capacitance associated with a system design has been achieved.

Figure 2:
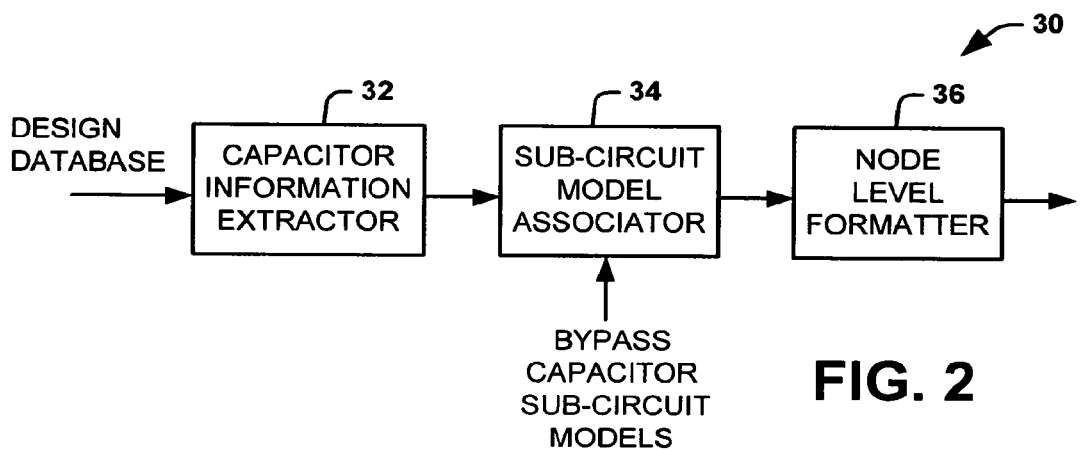
FIG. 2 illustrates a block diagram of an embodiment of a node level model generator.

FIG. 2 illustrates a node level model generator 30. The node level model generator 30 includes a capacitor information extractor 32. The capacitor information extractor 32 extracts capacitor information from a design database associated with a given circuit and/or package design. The design database can be provided by a package routing tool in the form of one or more design reports. The capacitor information can include capacitor type information, capacitor location information, netlist assignment information, and capacitor orientation for each of a plurality of bypass capacitors. The capacitor information extractor 32 provides the capacitor information to a sub-circuit model associator 34. The sub-circuit model associator 34 associates bypass capacitor sub-circuit models with each of the plurality of bypass capacitors based on capacitor type. The sub-circuit model associator 34 provides the capacitor information and associated bypass capacitor sub-circuit models to a node level formatter 36.

The node level formatter 36 generates a node level bypass capacitor model report formatted for inputting into a design simulation tool. The node level bypass capacitor model report includes a node level bypass capacitor model for each of the plurality of bypass capacitors. The node level formatter employs the bypass capacitor sub-circuit models, the capacitor location information, netlist assignment information, and capacitor orientation to generate the node level bypass capacitor model report. The node level bypass capacitor model report can be in the form of a SPICE deck for providing to a SPICE design analysis tool. A SPICE deck is a SPICE sub-circuit data file that numerically describes the location and type of conductor and component in a design.

Figure 3:
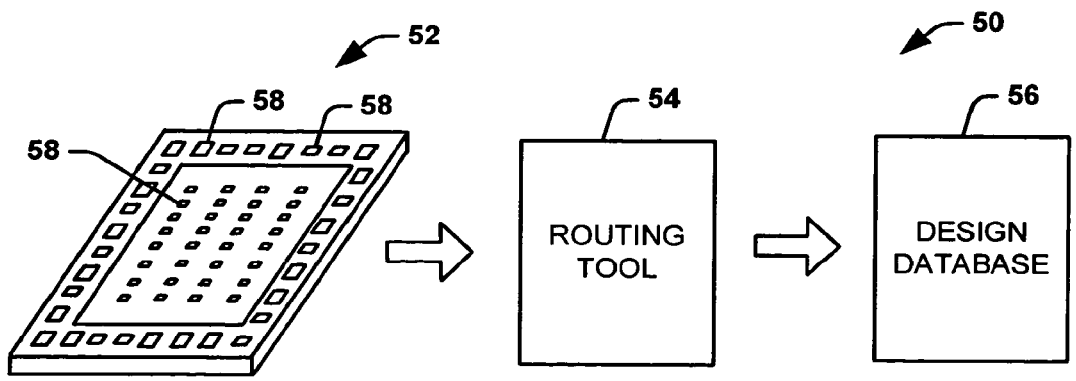
FIG. 3 illustrates an embodiment of a system for generating a design database.

FIG. 3 illustrates a system 50 for generating a design database. The system 50 includes a routing, packaging or PCB design tool 54 (e.g., Cadence Advanced Package Designer (APD) tool). The routing tool 54 generates a design database 56 from a multi-layer structure design 52 (e.g., integrated circuit, ceramic substrate, PCB). The multi-layer structure design 52 includes a plurality of bypass capacitors 58. The plurality of bypass capacitors 58 can include a plurality of bypass capacitor types (e.g., LICCs, MLCs, LICAs, and IDCs). The plurality of bypass capacitors can be distributed in a central signal region and/or along an outer perimeter of the multi-layer structure design 52. The routing tool 54 can also be operative to generate one or more bypass capacitor reports from the design database 56. The bypass capacitor information in the one or more bypass capacitor reports can be employed by the node level model generator of FIGS. 1–2 to provide the node level bypass capacitor models for each of the plurality of capacitors associated with the multi-layer structure design 52.

Figure 4:
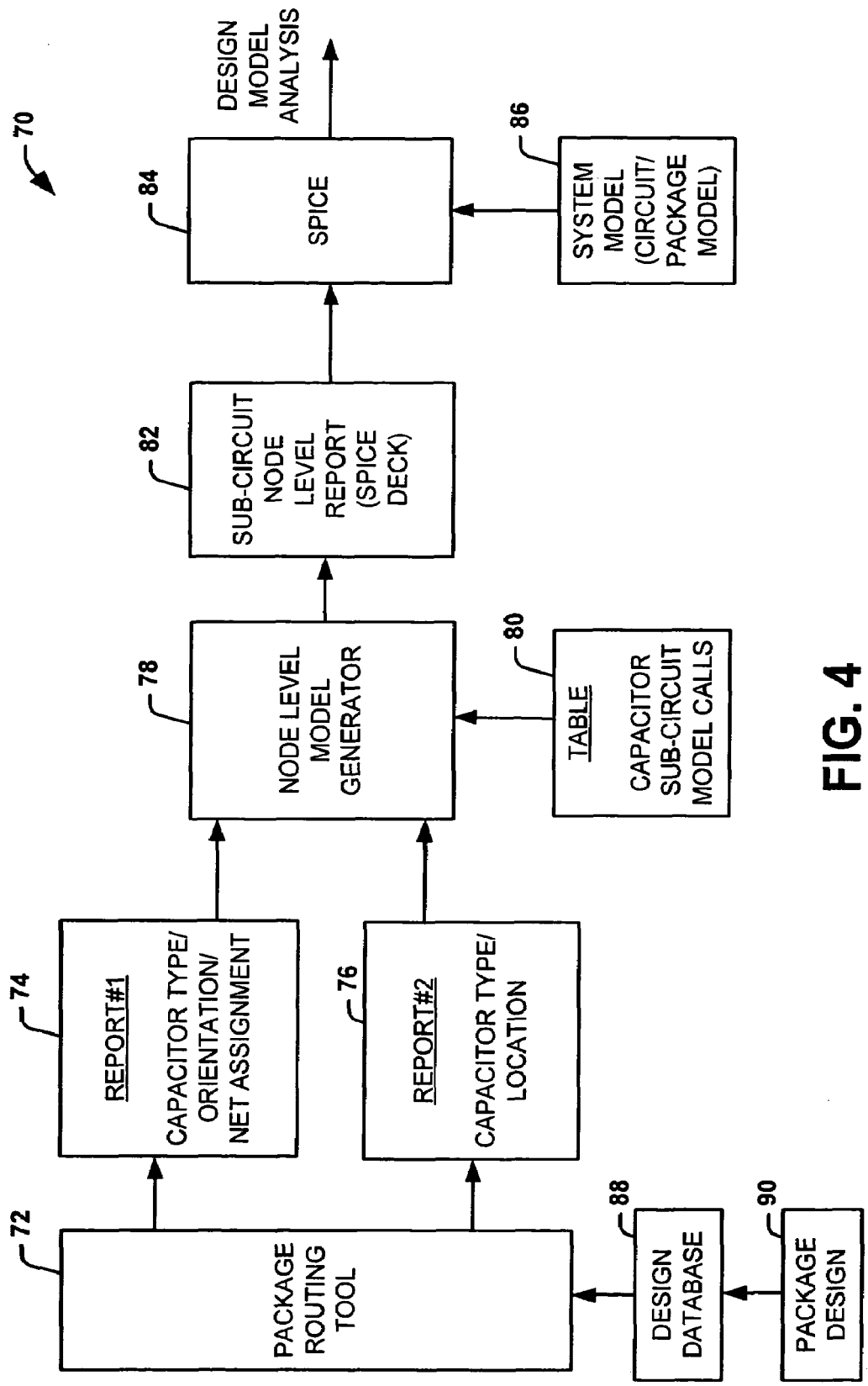
FIG. 4 illustrates a block diagram of an embodiment of a system for generating a node level bypass capacitor model report from package design information from a package routing tool.

FIG. 4 illustrates a system 70 for generating a node level bypass capacitor model report from package design information provided by a package routing tool. The system 70 includes a package routing tool 72 that generates reports from a design database 88 associated with a package design 90. The reports include a first report 74 that includes bypass capacitor information, such as capacitor type information, capacitor orientation information and net assignment information associated with each of the bypass capacitors in the package design 90. The reports also include a second report 76 that includes bypass capacitor information such as capacitor type information and capacitor location information on the package design 90 associated with each of the bypass capacitors in the package design 90. A node level model generator 78 extracts capacitor information from the first report 74 and the second report 76. In particular, the node level model generator 78 extracts capacitor type information, capacitor location information, netlist assignment information, and capacitor orientation information associated with each of a plurality of bypass capacitors. The node level model generator 78 then associates each of the plurality of bypass capacitors with a bypass capacitor sub-circuit model call, based on a given capacitor type, from a plurality of bypass capacitor sub-circuit model calls residing in a look up table 80. As previously stated, the given capacitor types can include, for example, LICCs, MLCs, LICAs, and IDCs and other capacitor types of varying characteristics.

The bypass capacitor sub-circuit model calls in the table 80 provide SPICE models for a plurality of bypass capacitors distributed over the package design 90. The package design 90 can be an integrated circuit, a ceramic substrate and/or a printed circuit board assembly. The bypass capacitor sub-circuit model calls include a plurality of resistor-inductor-capacitor (RLC) representations for each of a given bypass capacitor type. The node level model generator 78 employs the capacitor sub-circuit model calls along with the capacitor location information, netlist assignment information, and capacitor orientation to generate a sub-circuit node level report 82 in the form of a SPICE deck. The bypass capacitor SPICE deck 82 can be provided to a SPICE tool 84 concurrently with a system model 86. The system model 86 can include circuit and/or package design models in the form of SPICE decks associated with a given package design 90. The SPICE tool 84 can then perform simulations to analyze voltage droop, power, and AC effects to determine if a desirable bypass capacitance associated with a package design has been achieved.

Figure 5:
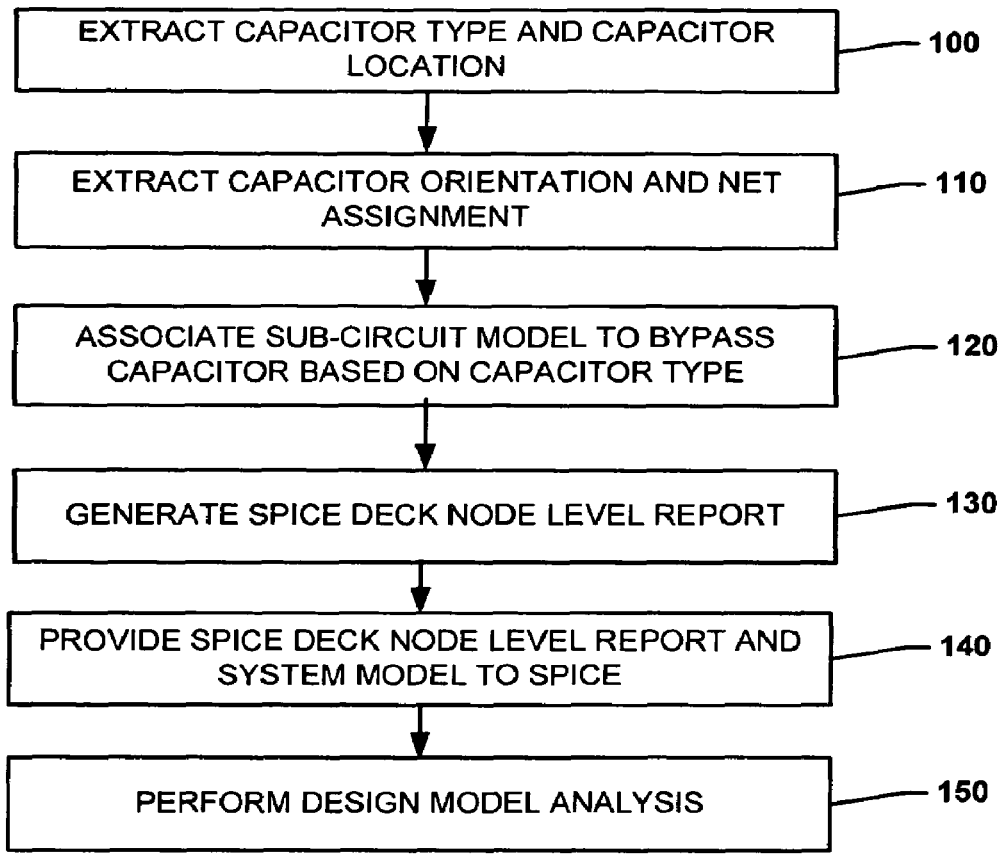
FIG. 5 illustrates an embodiment of a method for generating a node level bypass capacitor model.
Figure 6:
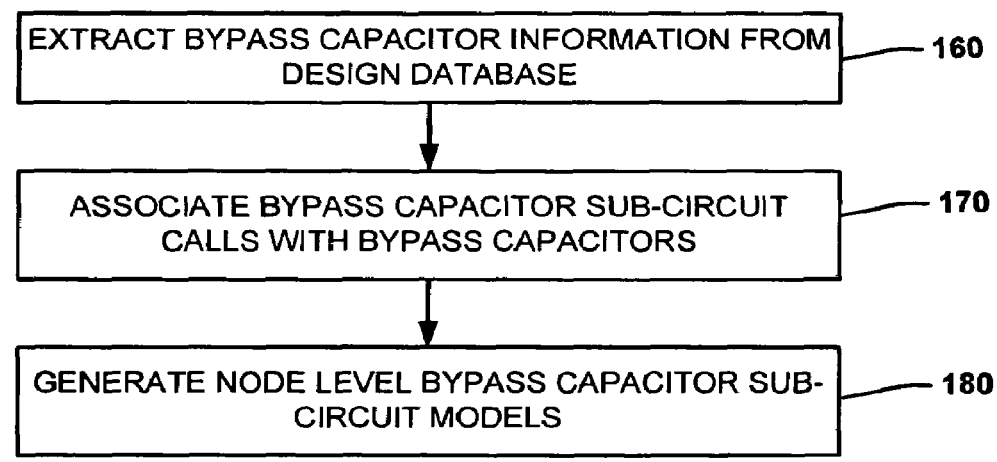
FIG. 6 illustrates another embodiment of a method for generating a node level bypass capacitor model.

In view of the foregoing structural and functional features described above, certain methods will be better appreciated with reference to FIGS. 5–6. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., as one or more integrated circuits or circuit boards containing a plurality of microprocessors), software (e.g., as executable instructions running on one or more processors), or any combination thereof.

FIG. 5 illustrates a methodology for generating a node level bypass capacitor model. The methodology begins at 100 where capacitor type and capacitor location information is extracted from a first report generated from a design database associated with a package design (e.g., integrated circuit, ceramic substrate and/or PCB) for each of a plurality of bypass capacitors. At 110, capacitor orientation and capacitor net assignment information is extracted from a second report generated from the design database associated with the package design for each of the plurality of bypass capacitors. The design database can be generated by a routing tool based on a given PCB design. The routing tool can also generate the first report and the second report based on the design database. The methodology then proceeds to 120.

At 120, the methodology associates a sub-circuit bypass capacitor model to each of the plurality of bypass capacitors based on a given capacitor type. The sub-circuit bypass capacitor can be a RLC representation of a given bypass capacitor type. The sub-circuit bypass capacitor, for example, can be a SPICE sub-circuit call. At 130, a SPICE deck node level report is generated. The SPICE deck node level report includes a plurality of node level capacitor models for each of the plurality of bypass capacitors of the given package design. The plurality of node level capacitor models are generated by employing the capacitor location information, the capacitor geometry information, the capacitor netlist information and the respective node level capacitor model or SPICE sub-circuit call associated with each of the respective plurality of bypass capacitors. The methodology then proceeds to 140.

At 140, the SPICE deck node level bypass capacitor model report and a system model (e.g., circuit and/or package model) are concurrently provided to a SPICE tool. At 150, design model analysis is performed on the SPICE deck node level bypass capacitor model report and the system model. The SPICE tool can perform simulations to analyze voltage droop, power, and AC effects to determine if a desirable bypass capacitance associated with a system design has been achieved.

FIG. 6 illustrates an alternate methodology for generating a node level bypass capacitor model. At 160, bypass capacitor information is extracted from a design database associated with a package design. At 170, bypass capacitor sub-circuit model calls are associated with each of a plurality of bypass capacitors based on a given bypass capacitor type. At 180, a plurality of node level bypass capacitor sub-circuit models are generated based on the bypass capacitor information for each of the plurality of bypass capacitors.

Figure 7:
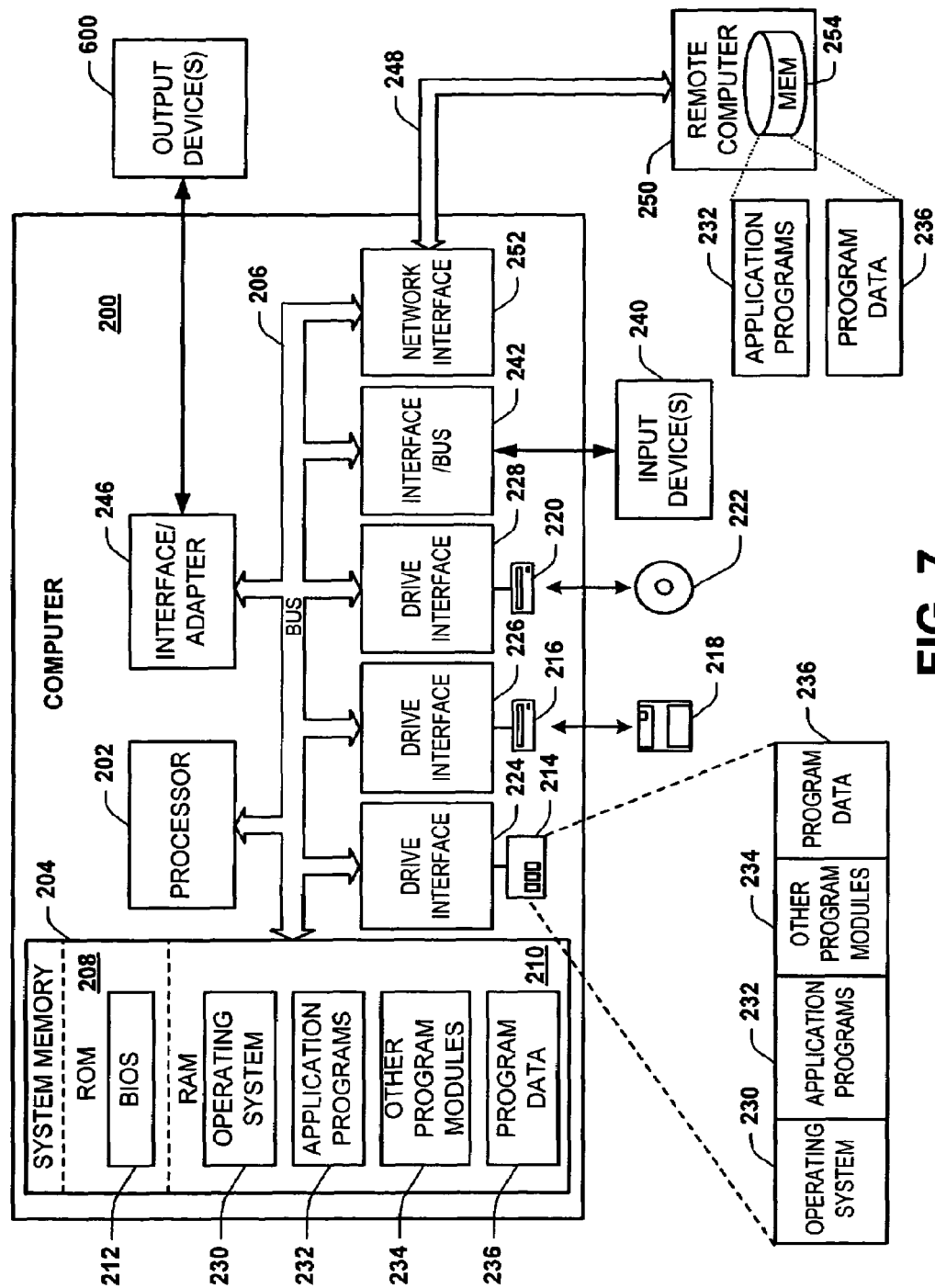
FIG. 7 illustrates an embodiment of a computer system.

FIG. 7 illustrates a computer system 200 that can be employed to implement systems and methods described herein, such as based on computer executable instructions running on the computer system. The computer system 200 can be implemented on one or more general purpose networked computer systems, embedded computer systems, routers, switches, server devices, client devices, various intermediate devices/nodes and/or stand alone computer systems. Additionally, the computer system 200 can be implemented as part of the computer-aided engineering (CAE) tool running computer executable instructions to perform a method as described herein.

The computer system 200 includes a processor 202 and a system memory 204. A system bus 206 couples various system components, including the system memory 204 to the processor 202. Dual microprocessors and other multi-processor architectures can also be utilized as the processor 202. The system bus 206 can be implemented as any of several types of bus structures, including a memory bus or memory controller, a peripheral bus, and a local bus using any of a variety of bus architectures. The system memory 204 includes read only memory (ROM) 208 and random access memory (RAM) 210. A basic input/output system (BIOS) 212 can reside in the ROM 208, generally containing the basic routines that help to transfer information between elements within the computer system 200, such as a reset or power-up.

The computer system 200 can include a hard disk drive 214, a magnetic disk drive 216, e.g., to read from or write to a removable disk 218, and an optical disk drive 220, e.g., for reading a CD-ROM or DVD disk 222 or to read from or write to other optical media. The hard disk drive 214, magnetic disk drive 216, and optical disk drive 220 are connected to the system bus 206 by a hard disk drive interface 224, a magnetic disk drive interface 226, and an optical drive interface 234, respectively. The drives and their associated computer-readable media provide nonvolatile storage of data, data structures, and computer-executable instructions for the computer system 200. Although the description of computer-readable media above refers to a hard disk, a removable magnetic disk and a CD, other types of media which are readable by a computer, may also be used. For example, computer executable instructions for implementing systems and methods described herein may also be stored in magnetic cassettes, flash memory cards, digital video disks and the like.

A number of program modules may also be stored in one or more of the drives as well as in the RAM 210, including an operating system 230, one or more application programs 232, other program modules 234, and program data 236. For example, the application programs 232 can include executable instructions programmed to generate node level bypass capacitor models from bypass capacitor information extracted from a design database associated with a package design. The executable instructions can associate capacitor sub-circuit models based on the capacitor information to generate a plurality of node level capacitor models associated with each of a plurality of bypass capacitors of the package design. The plurality of node level capacitor models can be stored as the program data 236 or, alternatively, as part of an application program 232. The application programs 232 further contains code operative to execute simulations on the node level capacitor models to determine if a desirable bypass capacitance has been achieved for the given design.

A user may enter commands and information into the computer system 200 through user input device 240, such as a keyboard, a pointing device (e.g., a mouse). Other input devices may include a microphone, a joystick, a game pad, a scanner, a touch screen, or the like. These and other input devices are often connected to the processor 202 through a corresponding interface or bus 242 that is coupled to the system bus 206. Such input devices can alternatively be connected to the system bus 206 by other interfaces, such as a parallel port, a serial port or a universal serial bus (USB). One or more out device(s) 244, such as a visual display device or printer, can also be connected to the system bus 206 via an interface or adapter 246.

The computer system 200 may operate in a networked environment using logical connections 248 to one or more remote computers 250. The remote computer 248 may be a workstation, a computer system, a router, a peer device or other common network node, and typically includes many or all of the elements described relative to the computer system 200. The logical connections 248 can include a local area network (LAN) and a wide area network (WAN).

When used in a LAN networking environment, the computer system 200 can be connected to a local network through a network interface 252. When used in a WAN networking environment, the computer system 200 can include a modem (not shown), or can be connected to a communications server via a LAN. In a networked environment, application programs 232 and program data 236 depicted relative to the computer system 200, or portions thereof, may be stored in memory 254 of the remote computer 250.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for generating node level bypass capacitor models, the system comprising:
    a plurality of bypass capacitor circuit models associated with respective bypass capacitor types; and
    a node level model generator that associates bypass capacitor information for a plurality of bypass capacitors from a data base associated with a multi-layer structure design with respective bypass capacitor circuit models to provide node level capacitor models for the plurality of bypass capacitors.

2. The system of claim 1, wherein the bypass capacitor information comprises capacitor type information, capacitor location information, netlist assignment information, and capacitor orientation information associated with each of the plurality of bypass capacitors.

3. The system of claim 2, wherein the database is generated by a package routing tool, and the bypass capacitor information is provided by a first report that includes capacitor type information, netlist assignment information, and capacitor orientation information and a second report that includes capacitor type information and capacitor location information.

4. The system of claim 1, wherein the node level model generator employs capacitor type information of the plurality of bypass capacitors to associate bypass capacitors with respective bypass capacitor circuit models.

5. The system of claim 1, wherein the node level capacitor model is a Simulation Program with Integrated Circuit Emphasis (SPICE) deck.

6. The system of claim 5, wherein the node level capacitor model is provided to a SPICE program along with a system model to determine if a desirable bypass capacitance associated with a system design has been achieved.

7. The system of claim 1, wherein the plurality of bypass circuit models are Simulation Program with Integrated Circuit Emphasis (SPICE) sub-circuit models that provide a model of a respective bypass circuit as a RLC model.

8. The system of claim 1, further comprising a table that includes the plurality of bypass circuit models and associated bypass capacitor types.

9. A system for generating a node level capacitor model report from package design information provided by a package routing tool, the system comprising:
    a table that contains a plurality of bypass capacitor circuit models associated with respective bypass capacitor types; and
    a node level model generator that extracts capacitor type information, capacitor location information, and capacitor netlist assignment information from the package design information for a plurality of bypass capacitors associated with a design, the node level model generator associating a capacitor sub-circuit model with each of a plurality of bypass capacitors based on capacitor type, and providing a formatted node level bypass capacitor model report for the plurality of bypass capacitors employing the capacitor location information and capacitor netlist assignment information.

10. The system of claim 9, wherein the node level capacitor model report is a Simulation Program with Integrated Circuit Emphasis (SPICE) deck.

11. The system of claim 9, wherein the node level capacitor model report is provided to a Simulation Program with Integrated Circuit Emphasis (SPICE) program along with a system model report to determine if a desirable bypass capacitance associated with a system design has been achieved.

12. The system of claim 9, wherein the plurality of bypass circuit models are Simulation Program with Integrated Circuit Emphasis (SPICE) sub-circuit models that provide a model of a respective bypass circuit as a RLC model.

13. The system of claim 9, wherein the plurality of bypass capacitor types include at least two of Low Inductance Chip Capacitors (LICCs), Multilayer Ceramic Capacitors (MLCs), Low Inductance Capacitor Arrays (LICAs), and Inter Digitated Capacitors (IDCs).

14. A design tool for providing a node level bypass capacitor model from a package design, the tool comprising:
    means for listing a plurality of bypass capacitor sub-circuit models based on bypass capacitor type;

means for extracting capacitor type, location and netlist information for a plurality of bypass capacitors from one or more package design reports;

means for associating bypass capacitor sub-circuit models with bypass capacitor types for the plurality of bypass capacitor types; and means for generating a formatted node level bypass capacitor model report based on the location and netlist information for each of the plurality of bypass capacitors.

15. The system of claim 14, wherein the node level bypass capacitor model report is a Simulation Program with Integrated Circuit Emphasis (SPICE) deck and the plurality of bypass capacitor sub-circuit models are SPICE sub-circuit models that provide a model of a respective bypass capacitor as a RLC model.

16. The system of claim 14, further comprising means for analyzing the design based on the node level bypass capacitor model report and a system model report to determine if a desirable bypass capacitance associated with the design has been achieved.

17. A computer readable medium having computer executable instructions for performing a method comprising:

extracting bypass capacitor information for a plurality of bypass capacitors from a design database associated with a package design;

associating bypass capacitor sub-circuit model calls with each of a plurality of bypass capacitors based on a given bypass capacitor type; and generating a plurality of node level bypass capacitor sub-circuit models based on the extracted capacitor information for each of the plurality of bypass capacitors.

18. The computer readable medium of claim 17, wherein the plurality of node level bypass capacitor sub-circuit models are in a form of a Simulation Program with Integrated Circuit Emphasis (SPICE) deck.

19. The computer readable medium of claim 17, wherein the capacitor information comprises bypass capacitor type information, bypass capacitor location information and bypass capacitor netlist information for a plurality of bypass capacitors.

20. The computer readable medium of claim 19, wherein the extracting comprises extracting bypass location information from a first report generated from a routing tool and extracting bypass capacitor netlist information from a second report generated from the routing tool.

21. The computer readable medium of claim 17, further comprising providing the node level bypass capacitor models and a system model to a Simulation Program with Integrated Circuit Emphasis (SPICE) program to determine if a desirable bypass capacitance associated with a system design has been achieved.

22. A method for generating node level bypass capacitor models comprising:

extracting bypass capacitor information for a plurality of bypass capacitors from a design database associated with multi-layer structure design;

associating a bypass capacitor sub-circuit model with each of a plurality of bypass capacitors based on a given bypass capacitor type; and generating a plurality of node level bypass capacitor models based on the extracted capacitor information and the associated bypass capacitor sub-circuit model for each of the plurality of bypass capacitors.

23. The method of claim 22, wherein the plurality of node level bypass capacitor sub-circuit models are in a form of a Simulation Program with Integrated Circuit Emphasis (SPICE) deck.

24. The method of claim 22, wherein the capacitor information comprises bypass capacitor type information, bypass capacitor location information and bypass capacitor netlist information for a plurality of bypass capacitors.

25. The method of claim 24, wherein the extracting comprises extracting bypass location information from a first report generated from a routing tool and extracting bypass capacitor netlist information from a second report generated from the routing tool.

26. The method of claim 22, further comprising providing the node level bypass capacitor models and a system model to a Simulation Program with Integrated Circuit Emphasis (SPICE) program to determine if a desirable bypass capacitance associated with a system design has been achieved.

* * * * *